Figure 1:
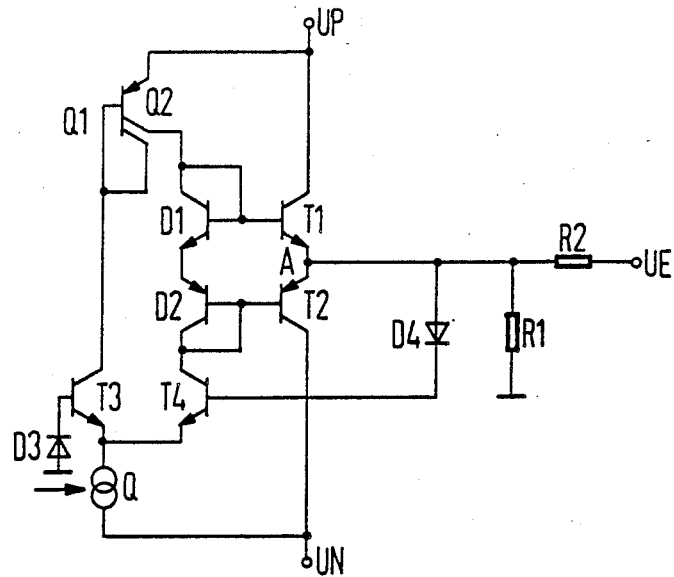

United States Patent [19]

Kriedt et al.

[11] Patent Number: 4,937,478
[45] Date of Patent: Jun. 26, 1990

[54] CIRCUIT CONFIGURATION FOR LOW-DISTORTION SIGNAL SWITCHING

[75] Inventors: Hans Kriedt, Munich; Wladimir Mueller, Valley/Grub, both of Fed. Rep. of Germany

[73] Assignee: Siemens Aktiengesellschaft, Munich, Fed. Rep. of Germany

[21] Appl. No.: 309,385

[22] Filed: Feb. 10, 1989

[30] Foreign Application Priority Data

Feb. 10, 1988 [DE] Fed. Rep. of Germany ....... 3804068

[51] Int. Cl.$^5$ ........................ H03K 5/08; H03K 17/60
[52] U.S. Cl. .................................. 307/490; 307/264; 307/494; 307/540
[58] Field of Search ............... 307/490, 494, 264, 555, 307/296.1, 296.6, 540

[56] References Cited

U.S. PATENT DOCUMENTS 4,513,242  4/1985  Yokogawa ........................... 307/264
4,644,198  2/1987  Ahmed ................................ 307/264
4,767,946  8/1988  Taylor ................................ 307/264

OTHER PUBLICATIONS

Integrated Circuit Linear Databook, RCA, 1976, p. 200.

Primary Examiner—John Zazworsky
Attorney, Agent, or Firm—Herbert L. Lerner; Laurence A. Greenberg

[57] ABSTRACT

A circuit configuration for low-distortion switching of signals to a given operating potential includes a counter-coupled operational amplifier having an output, a push-pull end stage connected to the output, a differential amplifier stage connected to the push-pull end stage, a switchable resting current source for the differential amplifier stage, and a segment to be switched. The segment has end points being defined by the output of the operational amplifier and a reference potential being the reference potential of the operational amplifier.

7 Claims, 1 Drawing Sheet

CIRCUIT CONFIGURATION FOR LOW-DISTORTION SIGNAL SWITCHING

The invention relates to a circuit configuration for low-distortion signal switching to a given operating potential, having an operational amplifier with a push-pull end stage and a switchable resting current source for a differential amplifier stage of the operational amplifier.

In operational amplifiers having a push-pull end stage and a switchable resting current source for a differential amplifier stage of the operational amplifier, it is known to switch signals present at the input to the output of the operational amplifier, by setting the total gain to a given value or to the value zero by turning the resting current of the differential amplifier stage of the operational amplifier ON or OFF. This is discussed, for example, in the Integrated Circuit Linear Databook, RCA, 1976, page 200.

In so doing, the signal to be switched must be guided through the operational amplifier, although the operational amplifier causes distortion of the signal to be switched. Efforts to reduce the distortion caused by the operational amplifier entail increased expense for circuitry.

It is accordingly an object of the invention to provide a circuit configuration for low-distortion signal switching, which overcomes the hereinafore-mentioned disadvantages of the heretofore-known devices of this general type and to do so at low expense using a controllable semiconductor switch.

With the foregoing and other objects in view there is provided, in accordance with the invention, a circuit configuration for low-distortion switching of signals to a given operating potential, comprising an operational amplifier with negative feedback having an output, a push-pull end stage connected to the output, a differential amplifier stage connected to the push-pull end stage, a switchable resting current source for the differential amplifier stage, and a segment to be switched having end points being defined by the output of the operational amplifier and a reference potential being the reference potential of the operational amplifier.

In accordance with another feature of the invention, the negative feedback is selected in such a way that the total gain equals 1.

In accordance with a further feature of the invention, there is provided a resistor connected between the output of the operational amplifier and the reference potential.

In accordance with an added feature of the invention, there is provided a resistor through which the signal is fed to the output of the operational amplifier.

In accordance with an additional feature of the invention, the reference potential is ground.

In accordance with a concomitant feature of the invention, the differential amplifier stage has inputs, and there are provided diodes connected to the inputs of the differential amplifier stage.

The invention has the advantage of low expense for circuitry, because the influence of the operational amplifier on the signal form is kept low due to its operation as a short-circuit switch. No provisions for improving the transmission properties need be made, because contrary to the usual practice, the signal to be switched is not guided through the operational amplifier but instead is present at its output, so that in constructing the operational amplifier, the simplest possible embodiments are sufficient.

Other features which are considered as characteristic for the invention are set forth in the appended claims Although the invention is illustrated and described herein as embodied in a circuit configuration for low-distortion signal switching, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 2:
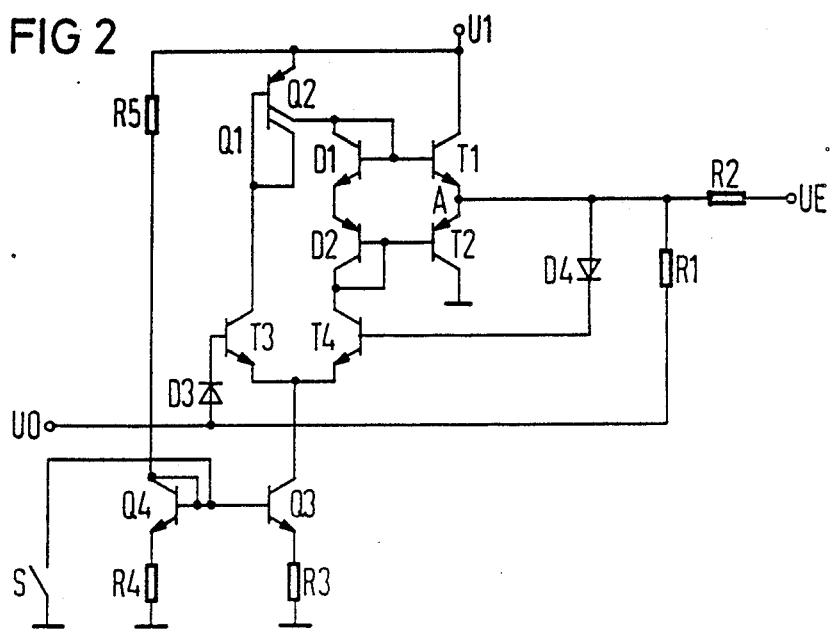

FIG. 1 is a schematic circuit diagram of a first embodiment of a circuit configuration according to the invention; and FIG. 2 is a circuit diagram of a second embodiment of a circuit configuration according to the invention Referring now to the figures of the drawings in detail and first, particularly, to FIG. 1 thereof, there is seen an operational amplifier constructed with a low expense for circuitry. The operational amplifier is substantially constructed of a push-pull end stage T1, T2, a differential amplifier stage T3, T4, a current source Q, and a current mirror Q1, Q2. The push-pull end stage is constructed as a complementary emitter follower with one n-p-n transistor T1 and one p-n-p transistor T2. In order to adjust the operating point, the base terminals of the two transistors are connected to one another by means of two series-connected diodes D1, D2 which are polarized in the conducting direction. The two transistors T3, T4 of the differential amplifier stage are n-p-n transistors. T3, T4, having emitter terminals which are joined together and connected through the current source Q to a negative operating potential UN. One transistor T3 of the differential amplifier stage has a base terminal connected to reference potential through a diode T3 which is polarized in the conducting direction The collector terminal of the transistor T3 is connected through an input current circuit Q1 of the current mirror to a positive operating potential UP. An output current circuit Q2 of the current mirror Q1, Q2 is coupled to the base terminal of the transistor T1. The negative feedback of the operational amplifier is effected through a diode D4 which is polarized in the conducting direction, from the interconnected emitter terminals of the end stage transistors, which are referred to below as the output A of the operational amplifier, to the base terminal of the second transistor T4 of the differential amplifier stage. In this case the inputs of the operational amplifier are represented by the base terminals of the transistors T3 and T4. The advantage of connecting the inputs of the operational amplifier with the diodes D3, D4 is substantially the elimination of impermissible potential differences at the inputs. The collector terminal of the transistor T4 is connected directly to the base terminal of the transistor T2. The signal to be switched is fed through a resistor R2 connected to a signal input UE, to the output of the operational amplifier, which is connected through a second resistor R1 to reference potential. The advantage of such wiring is first that the transient resistance of the circuit configuration assumes a defined value in both operating situations and second that given suitable dimensioning of the resistor R2, the end stage transistors T1, T2 of the operational amplifier are protected from overloading in short-circuit operation. In the present case, ground has been selected as the reference potential. This is advantageous, for instance, in connection with electric circuits that are operated with a symmetrical voltage supply and the reference potential thereof, namely ground, is thus fixed.

The circuit configuration shown in FIG. 2 is a development of that shown in FIG. 1. The difference, however, is that the negative operating potential is at ground and the reference potential of the circuit is at a given value UO between ground and positive operating potential. The current source for the resting current of the differential amplifier stage is also formed by the following circuit configuration: an n-p-n transistor Q4 which is connected as a diode has an emitter terminal connected through a resistor R4 to ground and a collector terminal connected through a further resistor R5 to the positive operating potential.

The base terminal of the transistor Q4 is connected directly to the base terminal of a second transistor Q3. The emitter terminal of the transistor Q3 is in turn connected through a resistor R3 to ground. The emitter terminals of the two transistors of the differential amplifier stage are connected directly to the collector terminal of the transistor Q3. The base terminal of the transistor Q4 is short-circuited to ground and the constant current source is thereby switched off, by switching over a switch S.

In both exemplary embodiments, the negative feedback is selected in such a way that the gain equals 1. This is particularly advantageous because no additional expense for circuitry is needed when the goal is simplicity.

Now that the fundamental construction of the circuit configuration shown in the drawing has been explained, the mode of operation of this circuit configuration will be described in further detail.

With the resting current source Q switched off, the current which is required for adjusting the operating point of the push-pull end stage and which flows through the transistor T4, the diodes D1 and D2 and the current mirror, becomes equal to zero. This blocks the end stage transistors and the output of the operational amplifier shifts to a high-resistance state as compared with the two operating potentials and the reference potential. The value for the transient resistance between the signal input UE and the reference potential becomes the sum of the resistances of the two resistors R1 and R2.

With the current source Q switched on, the operational amplifier regulates its output in such a way that the same potential is present at the base terminals of both transistors of the differential amplifier stage. Since the base terminal of the transistor T3 is connected through the diode D3 to reference potential, the reference potential is also established at the output of the operational amplifier, which is connected through the diode D4 to the base terminal of the transistor T4. The transient resistance between the signal input UE and reference potential is thus defined by the resistor R2. The potential equalization at the output of the operational amplifier is effected in such a way that with a positive half-wave of the input signal, the transistor T2 becomes the one that is more strongly conductive, while at the negative half-wave the transistor T1 becomes the more strongly conductive.

Finally, it should also be noted that operation of the circuit configuration with opposite polarity becomes possible by replacing p-n-p transistors with n-p-n transistors, and vice versa. The construction of the operational amplifier is also not restricted merely to bipolar transistors, but can also be carried out with CMOS transistors. This even further reduces the already low power requirement of the circuit configuration which is shown.

The foregoing is a description corresponding in substance to German Application No. P 38 04 068.9, dated Feb. 10, 1988, the International priority of which is being claimed for the instant application, and which is hereby made part of this application. Any material discrepancies between the foregoing specification and the aforementioned corresponding German application are to be resolved in favor of the latter.

We claim:

1. Circuit for low-distortion switching of signals to a given reference potential, comprising
    an operational amplifier having an output terminal connected to the signals, the operational amplifier having:
    a push-pull stage connected between two terminals connected to respective first and second supply potentials, forming an output terminal of said operational amplifier, and having inputs;
    a differential amplifier stage having two inputs forming respective first and second inputs of said operational amplifier;
    a controllable current source for supplying current to said differential amplifier;
    coupling means for coupling said differential amplifier stage to said inputs of said push-pull stage;
    a negative feedback circuit connecting said first input of said operational amplifier with said output terminal of said operational amplifier; and
    a reference potential connected to said second input of said operational amplifier.

2. Circuit configuration according to claim 1, wherein said negative feedback circuit is constructed in such a way that the total gain of said operational amplifier equals 1.

3. Circuit configuration according to claim 1, including a resistor connected between said output terminal of said operational amplifier and the reference potential.

4. Circuit configuration according to claim 1, including a resistor through which the signals are fed to said output terminal of said operational amplifier.

5. Circuit configuration according to claim 3, including a resistor through which the signals are fed to said output terminal of said operational amplifier.

6. Circuit configuration according to claim 1, wherein the reference potential is ground.

7. Circuit configuration according to claim 1, and including diodes in series with said inputs of said differential amplifier stage.

* * * * *